(12) United States Patent
Oh et al.

(10) Patent No.: US 11,565,582 B2
(45) Date of Patent: Jan. 31, 2023

(54) IN-WHEEL MOTOR DRIVING APPARATUS

(71) Applicant: LG ELECTRONICS INC., Seoul (KR)

(72) Inventors: Seung-Suk Oh, Seoul (KR); Hyoung Uk Nam, Seoul (KR); Eul Pyo Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 246 days.

(21) Appl. No.: 16/765,741

(22) PCT Filed: Mar. 7, 2019

(86) PCT No.: PCT/KR2019/002686
§ 371 (c)(1),
(2) Date: May 20, 2020

(87) PCT Pub. No.: WO2019/172696
PCT Pub. Date: Sep. 12, 2019

(65) Prior Publication Data
US 2020/0282822 A1  Sep. 10, 2020

(30) Foreign Application Priority Data
Mar. 9, 2018  (KR) ........................ 10-2018-0027801

(51) Int. Cl.
*B60K 7/00* (2006.01)
*H02K 11/215* (2016.01)
(Continued)

(52) U.S. Cl.
CPC .............. *B60K 7/0007* (2013.01); *B60G 3/00* (2013.01); *B60G 11/00* (2013.01);
(Continued)

(58) Field of Classification Search
CPC .............. B60G 11/00; B60G 2204/182; B60G 2204/30; B60G 2300/50; B60G 3/00; B60G 3/01; B60K 2007/0092; B60K 7/0007; B60K 2007/0038; B60K 2007/0061; G01R 33/0047; G01R 33/07; G01R 33/072; H01H 1/023; H02K 1/187; H02K 1/28; H02K 11/215; H02K 21/22; H02K 21/222; H02K 5/163; H02K 7/003; H02K 7/006;
(Continued)

(56) References Cited

U.S. PATENT DOCUMENTS

2014/0015382 A1  1/2014  Kim

FOREIGN PATENT DOCUMENTS

CN  1460076 A  12/2003
CN  1684851 A  10/2005
(Continued)

*Primary Examiner* — Naishadh N Desai
(74) *Attorney, Agent, or Firm* — Dentons US LLP (57) ABSTRACT

The present invention relates to an in-wheel motor driving apparatus for reducing weight, improving Hall sensor assembly performance, and reducing a defect rate. According to one embodiment of the present invention, the weight of an in-wheel motor can be reduced by separating a suspension housing and a shaft and applying different materials thereto. Furthermore, the ease of assembling a Hall sensor can be improved, and the defect rate can be reduced.

18 Claims, 8 Drawing Sheets

(51) Int. Cl.
  *B60G 3/00* (2006.01)
  *B60G 11/00* (2006.01)
  *G01R 33/00* (2006.01)
  *G01R 33/07* (2006.01)
  *H02K 5/16* (2006.01)
  *H02K 7/00* (2006.01)
  *H02K 7/08* (2006.01)
  *H02K 21/22* (2006.01)

(52) U.S. Cl.
  CPC ......... *G01R 33/0047* (2013.01); *G01R 33/07* (2013.01); *H02K 5/163* (2013.01); *H02K 7/003* (2013.01); *H02K 7/006* (2013.01); *H02K 7/085* (2013.01); *H02K 11/215* (2016.01); *H02K 21/22* (2013.01); *B60K 2007/0092* (2013.01)

(58) Field of Classification Search
  CPC .......... H02K 7/085; H02K 7/088; H02K 7/14; Y02T 10/64
  See application file for complete search history.

(56) References Cited

FOREIGN PATENT DOCUMENTS

| | | | | |
|---|---|---|---|---|
| CN | 103066740 A | | 4/2013 | |
| EP | 1380459 A1 | * | 1/2004 | ............... B60G 3/20 |
| EP | 1380459 A1 | | 1/2004 | |
| JP | 2002-252955 A | | 9/2002 | |
| JP | 2003-300420 A | | 10/2003 | |
| JP | 2004115014 A | * | 4/2004 | ............... B60G 3/20 |
| JP | 2005153724 A | * | 6/2005 | |
| JP | 2005289321 A | * | 10/2005 | |
| JP | 2005-329767 A | | 12/2005 | |
| JP | 2005-329909 A | | 12/2005 | |
| JP | 2005329767 A | * | 12/2005 | |
| JP | 4575298 B2 | * | 11/2010 | ........... B60K 7/0007 |
| JP | 2013129283 A | | 7/2013 | |
| KR | 10-1127736 B1 | | 3/2012 | |
| KR | 10-1792434 B1 | | 11/2017 | |
| WO | 9206530 A1 | | 4/1992 | |

* cited by examiner

IN-WHEEL MOTOR DRIVING APPARATUS

This application is a 35 USC § 371 National Stage entry of International Application No. PCT/KR2019/002686, filed on Mar. 7, 2019, which claims the benefit of priority of Korean Patent Application No. 10-2018-0027801, filed on Mar. 9, 2018, all of which are incorporated by reference in their entirety herein.

TECHNICAL FIELD

The present disclosure relates to an in-wheel motor driving apparatus that may ensure a reduction in weight of an in-wheel motor, improvement in ease of assembling a Hall sensor and a lower defect rate by separating a suspension and a shaft.

BACKGROUND ART

Futuristic transportation devices for rapidly traveling a short distance are required at a time when a range of activity becomes wider and an amount of activity becomes larger in centers of cities. Additionally, a range of leisure cultures to which the transportation devices are applied becomes wider.

In terms of the futuristic transportation devices, electric energy stored in a battery rather than fossil fuels such as gasoline, diesel oil and the like may be used to drive a motor. A typical example of the motor is an in-wheel motor.

The in-wheel motor is a system used for transportation means powered by electricity. Power output from a motor disposed in a rim may be directly delivered to a wheel.

In case the in-wheel motor is applied to a transportation device, a device for driving and a device for delivering power such as an engine, a transmission, a gear and the like may be omitted. Accordingly, the transportation device may become lightweight and loss of energy during a process of delivering power may be reduced.

An in-wheel motor for an electric vehicle is disclosed in Korean Patent Publication No. 10-2012-0095721 (published on Aug. 29, 2012 and referred to as "prior art document 1") as a prior art document relating to the present disclosure. The in-wheel motor for an electric vehicle disclosed in prior art document 1 includes a motor for generating rotational power, a speed reducer for delivering rotational power of the motor, a hub installed at the front of the speed reducer, a disc assembled to the hub and a wheel. However, a suspension housing and a suspension assembly and the like are not disclosed in prior art document 1. Accordingly, it is difficult to buffer and absorb an impact from a road surface.

Additionally, an in-wheel motor system is disclosed in Korean Patent Publication No. 10-2014-0132216 (published on Nov. 17, 2014 and referred to as "prior art document 2") as another prior art document relating to the present disclosure. For the in-wheel motor system in prior art document 2, a motor is mounted onto a rim of a wheel of a vehicle to directly drive the wheel. However, the in-wheel motor system does not include a suspension housing and a suspension assembly and the like. Accordingly, it is difficult to buffer and absorb an impact from a road surface.

Against this backdrop, there is a growing need for technologies for buffering and absorbing an impact from a road surface through the application of a suspension housing and a suspension assembly to an in-wheel motor, and realizing a lightweight in-wheel motor and ensuring improved ease in assembly and a lower defect rate on the basis of the structural improvement.

DISCLOSURE

Technical Problems

The present disclosure is directed to an in-wheel motor driving apparatus that may buffer an impact from a road surface and become lightweight.

The present disclosure is directed to an in-wheel motor driving apparatus that may ensure ease of assembling a Hall sensor to a substrate and a low defect rate of the Hall sensor.

Aspects of the present disclosure are not limited to the above-described ones. Additionally, other aspects and advantages that have not been mentioned can be clearly understood from the following description and can be more clearly understood from embodiments. Further, it will be understood that the aspects and advantages of the present disclosure can be realized via means and combinations thereof that are described in the appended claims.

Technical Solutions

According to one aspect of the present disclosure as a means to achieve one of the objectives, an in-wheel motor driving apparatus may buffer an impact from a road surface through a coupling of a suspension housing and a suspension assembly to an in-wheel motor, and may use different materials appropriate respectively for the suspension housing and a shaft that are separated.

To this end, the in-wheel motor driving apparatus according to an embodiment may comprise a circular rim, an outer wheel of which is surrounded by a tire, which is coupled to the tire, which is provided with a hollow portion therein, through which a shaft passes and to which the shaft is coupled, a motor assembly comprising a stator inserted through the hollow portion of the rim and a rotor disposed to face the stator, disposed to surround the stator and configured to rotate outside the stator, a bearing holder coupled to one side of the rim in a ring shape and configured to accommodate a bearing through an inner circumferential surface of the bearing holder, and a suspension module comprising a suspension housing an outer circumferential surface of which contacts the bearing, which is inserted into and fixed to the bearing holder and which is separated from the shaft, and a suspension assembly coupled into the suspension housing and provided with at least one buffer spring.

In this case, the stator therein may be provided with a stator hub connected in a radial form towards a center of the stator, and the shaft may pass through a center of the stator hub and may be coupled to the stator hub in a direction across the rim.

The suspension housing may comprise a circular plate inserted into the bearing holder and disposed to face the motor assembly, and an outer projection configured to protrude along an edge of the circular plate and disposed to contact the bearing through an outer circumferential surface thereof. The shaft may be coupled through a central portion of the circular plate, and when necessary, may be separated.

The suspension housing and the shaft may be made of different materials. For example, the shaft may be made of carbon steel for a mechanical structure for ensuring rigidity, and the suspension housing may be made of an aluminum-based material that weighs less than the material of the shaft.

Rigidity is an important factor for the shaft as the shaft is an area for supporting force in the in-wheel motor driving apparatus. To this end, carbon steel for a mechanical structure (e.g., S45C and the like) having excellent rigidity may be used for the shaft. Unlike the shaft, the suspension housing is not an area for supporting force in the in-wheel motor driving apparatus. Accordingly, a metallic material (e.g., aluminum and the like) that weighs less than the material of the shaft may be used for the suspension housing. In a structure where the suspension housing and the shaft are separated, different materials may be applied respectively to the suspension housing and the shaft. Accordingly, lower weight may be realized in the structure where the suspension housing and the shaft are separated rather than a structure where the suspension housing and the shaft are integrally formed.

According to another aspect of the present disclosure as a means to achieve the other objective, an in-wheel motor driving apparatus may ensure improved ease of assembling a Hall sensor and a lower defect rate of the Hall sensor using a structure where a Hall sensor substrate is molding-connected to the Hall sensor and is fixed to a suspension housing.

To this end, the in-wheel motor driving apparatus according to another embodiment may comprise a circular rim, an outer wheel of which is surrounded by a tire, which is coupled to the tire, which is provided with a hollow portion therein, through which a shaft passes and to which the shaft is coupled, a motor assembly comprising a stator inserted through the hollow portion of the rim and a rotor disposed to face the stator, disposed to surround the stator and configured to rotate outside the stator, a bearing holder coupled to one side of the rim in a ring shape and configured to accommodate a bearing through an inner circumferential surface of the bearing holder, and a suspension module comprising a suspension housing an outer circumferential surface of which contacts the bearing, which is inserted into and fixed to the bearing holder and which is separated from the shaft, and a suspension assembly coupled into the suspension housing and provided with at least one buffer spring. The suspension housing may comprise a circular plate inserted into the bearing holder and disposed to face the motor assembly, and an outer projection configured to protrude along an edge of the circular plate and disposed to contact the bearing through an outer circumferential surface thereof, and the in-wheel motor driving apparatus may further comprise a Hall sensor substrate coupled through one surface of the circular plate in a replaceable manner and provided with at least one Hall sensor molding-fixed to the Hall sensor substrate.

In this case, an outer surface of the Hall sensor substrate may contact one surface of the suspension housing and may be coupled and fixed to one surface of the suspension housing, and an inner surface of the Hall sensor substrate may be spaced apart from the stator, and the at least one Hall sensor may be coupled to an end of a Hall sensor molding portion integrally molded with the Hall sensor substrate while protruding from the inner surface of the Hall sensor substrate towards an outer circumferential surface of the stator.

Additionally, the circular plate may be provided with a screw hole at a position corresponding to a position to which the Hall sensor substrate is coupled, and the Hall sensor substrate may be mounted on one surface of the circular plate using a fixation screw coupled through the screw hole.

The Hall sensor, as described above, may be coupled to the Hall sensor substrate as a molding structure, and may not be directly attached to an outer diameter of the stator, resulting in a reduction in defect rates in sensing magnetic force of a magnet.

The Hall sensor substrate may be mounted onto one surface of the circular plate of the suspension housing in a replaceable manner. Accordingly, the Hall sensor substrate may be easily separated and replaced with no need to entirely disassemble the in-wheel motor for repairs and maintenance of the Hall sensor and Hall sensor substrate.

Advantageous Effects

According to the present disclosure, an impact from a road surface at the time of driving of a vehicle may be relieved and absorbed, and weight of an in-wheel motor may be reduced through separation of a suspension housing and a shaft of the in-wheel motor and through application of different materials to the suspension housing and the shaft.

According to the present disclosure, ease of assembling a Hall sensor to a substrate and a lower defect rate of a Hall sensor may be ensured. A Hall sensor of the related art is attached to an outer diameter of a stator and is soldered to a Hall sensor substrate, resulting in difficulty in assembly and in repairs and maintenance, as the in-wheel motor needs to be dissembled entirely. Further, the Hall sensor of the related art has a high defect rate. According to the present disclosure, the Hall sensor substrate and the Hall sensor may be molding-connected, and the Hall sensor substrate may be attached to the suspension housing. Accordingly, the in-wheel motor doesn't need to be disassembled entirely when the Hall sensor substrate is replaced, and the Hall sensor may be configured to sense a magnetic force of a magnet overhang, thereby lowering a defect rate.

Detailed effects of the present disclosure are described together with the above-described effects in the detailed description of the disclosure.

BEST MODE

Hereinafter, embodiments of the present disclosure are described in detail with reference to the drawings so that those skilled in the art to which the disclosure pertains can easily implement the embodiments. The present disclosure may be implemented in many different forms and is not limited to the embodiments set forth herein.

In order to clearly describe the present disclosure, technical explanation that is not directly related to the disclosure may be omitted, and identical or similar components are denoted by identical reference numerals throughout the specification. Further, some embodiments of the present disclosure are described in detail with reference to the exemplary drawings. In giving reference numerals to the components in each drawing, the same components may be given the same reference numeral as possible even when they are illustrated in different drawings. Further, in describing the present disclosure, detailed description of related known configurations or functions is omitted if it is deemed to make the gist of the present disclosure unnecessarily vague.

In describing the components of the disclosure, when any one component is described as being "connected," "coupled" or "connected" to another component, the component may be directly connected or may be able to be directly connected to another component; however, it is also to be understood that an additional component may be "interposed" between the two components, or the two components may be "connected", "coupled" or "connected" through an additional component.

Figure 1:
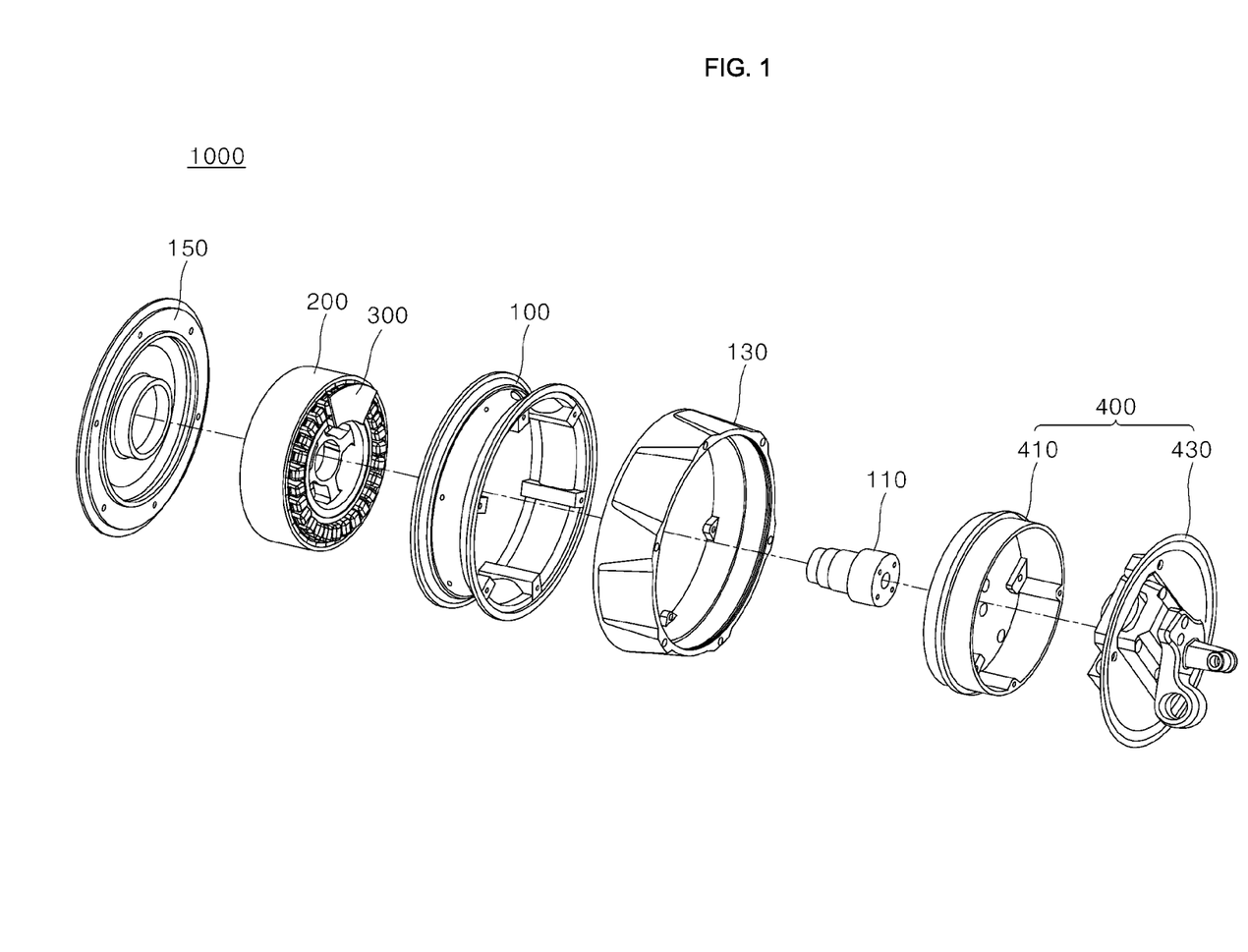
FIG. 1 is an exploded perspective view briefly illustrating an in-wheel motor driving apparatus according to an embodiment.
Figure 2:
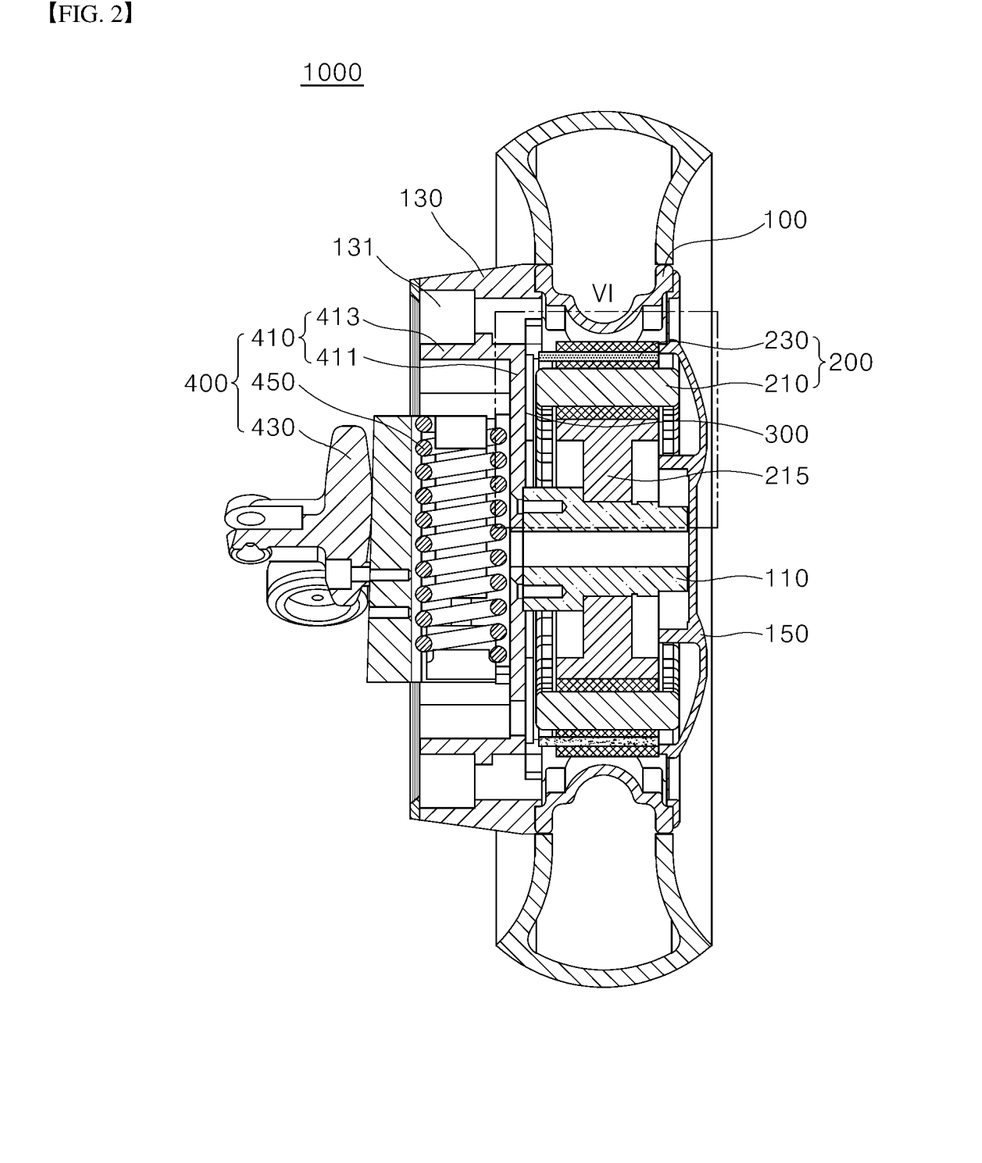
FIG. 2 is a cross-sectional view briefly illustrating an in-wheel motor driving apparatus according to an embodiment.

FIG. 1 is an exploded perspective view briefly illustrating an in-wheel motor driving apparatus according to an embodiment, and FIG. 2 is a cross-sectional view briefly illustrating an in-wheel motor driving apparatus according to an embodiment.

Referring to FIGS. 1 and 2, the in-wheel motor driving apparatus 1000 according to an embodiment may comprise a circle-shaped rim 100, a motor assembly 200, a bearing holder 130, a suspension module 400 and a rear cover 150.

The rim 100 may denote a circle-shaped rigid member the outer wheel of which is surrounded by a tire (not illustrated) and which is coupled to the tire. The rim 100 may be provided with a hollow portion having a predetermined size, therein.

The shaft 110 and the motor assembly 200 may be inserted through the hollow portion of the rim 100 and then may be coupled.

The motor assembly 200 may comprise a stator 210 (see FIG. 2) and a rotor 230 (see FIG. 2).

The stator 210 (see FIG. 2) may be inserted through the hollow portion of the rim 100.

The stator 210 (see FIG. 2) may be provided therein with a stator hub 215 (see FIG. 2) that connects towards a center of the stator in a radial form.

The shaft 110 may pass through a center of the stator hub 215 (see FIG. 2) and may be coupled to the stator hub in a direction across the rim 100.

The rotor 230 (see FIG. 2) may be disposed to surround and wrap the circle-shaped stator 210 (see FIG. 2). As such, the rotor 230 (see FIG. 2) may be formed into a rotatable structure outside the stator 210 (see FIG. 2).

For example, the stator 210 (see FIG. 2) may comprise a core where a plurality of poles is formed. A coil 211 (see FIG. 3) may be wound around each of the poles. The rotor 230 (see FIG. 2) may comprise a magnet (i.e., a permanent magnet). With the above-described configuration, electric current may be supplied to the stator 210 (see FIG. 2) and an electromagnetic force may be generated. Then, the rotor 230 (see FIG. 2) may rotate on the outskirts of the stator 210 (see FIG. 2).

That is, the stator 210 (see FIG. 2) may be coupled and fixed to the shaft 110 through the stator hub 215 (see FIG. 2) without rotating, and the rotor 230 (see FIG. 2) may be fixed to the rim 100 and may rotate together with the rim 100 and the tire.

The bearing holder 130 may be a ring-shaped member that is provided with a plurality of bearings 131 (see FIG. 2).

The plurality of bearings 131 (see FIG. 2) may be disposed in a circumferential direction through an inner circumferential surface of the bearing holder 130. The plurality of bearings 131 (see FIG. 2) may be disposed to face and contact an outer projection 413 of a below-described suspension housing 410.

The bearing holder 130 may be coupled to one side of the rim 100 (e.g., an inner side and the like of the rim). The bearing holder 130 may also be provided with a hollow portion. Through the hollow portion of the bearing holder 130, the suspension housing 410 may be inserted and fixed.

The suspension module 400 may buffer an impact from the road surface, which is delivered through the tire coupled to the rim 100 when a vehicle moves on the ground using the in-wheel motor driving apparatus 1000.

The suspension module 400 may comprise the suspension housing 410 and a suspension assembly 430 including at least one buffer spring 450.

An outer circumferential surface of the suspension housing 410 may contact the bearing 131 (see FIG. 2) and the suspension housing 410 may be inserted and fixed through the hollow portion of the bearing holder 130. Additionally, the suspension housing 410 may be separated from the shaft 110.

The suspension assembly 430 may be coupled into the suspension housing 410. The suspension assembly 430 may comprise at least one buffer spring 450. As such, the suspension assembly 430 may effectively absorb and buffer an impact from the road, which is delivered through the tire and rim 100.

The suspension housing 410, as illustrated in FIG. 2, may comprise a circular plate 411 and an outer projection 413.

Referring to FIG. 2, the circular plate 411 may be inserted into the hollow portion of the bearing holder 130, and may be disposed to face one side of the motor assembly 200, particularly, one surface of the stator 210.

The outer projection 413 may protrude in a ring form along an edge of the circular plate 411 and may have a predetermined projection length.

For example, a shape, where the circular plate 411 and the outer projection 413 protruding along the edge of the circular plate in a ring form are coupled, may be a cylindrical shape one surface of which is opened. The suspension assembly 430 may be inserted through a cylindrical accommodation space (i.e., a circular groove) that is formed through the opened one surface in the cylindrical shape. As such, the projection length of the outer projection 413 may be determined to correspond to a thickness of a partially inserted portion of the suspension assembly 430.

Additionally, an outer circumferential surface of the outer projection 413 may be disposed to contact the bearing 131 in a state where the circular plate 411 is inserted into the bearing holder 130 to face one surface of the stator 210. Accordingly, when the rim 100 rotates, the bearing holder 130 and the suspension module 400 may reducing friction caused by their contact while keep supporting each other.

The shaft 110 may pass through the center of the stator hub 215 and may be coupled to the stator hub 215 in the direction across the rim 100. Specifically, the shaft 110 may be coupled in a way that the shaft 110 protrudes perpendicularly from one surface of the circular plate through a central portion of the circular plate 411. That is, the shaft 110 and the suspension housing 410 may have a structure where the shaft and the suspension housing are separated from each other.

With the above-described structure, the shaft 110 and the suspension housing 410 may be made of different materials.

For example, the shaft 110 may be made of carbon steel for a mechanical structure (e.g., S45C and the like) for ensuring rigidity, and the suspension housing 410 may be made of a metallic material (e.g., aluminum and the like) that weights less than the material of the shaft 110.

The shaft 110 needs to ensure rigidity to bear force as the shaft 110 is a portion of the in-wheel motor driving apparatus 1000, on which load concentrates. Accordingly, carbon steel for a mechanical structure (e.g., S45C and the like) having excellent rigidity may be used for the shaft 110.

Unlike the shaft 110, the suspension housing 410 does not need to have rigidity similar to that of the shaft 110 as the suspension housing 410 is not a portion of the in-wheel motor driving apparatus, to which a great load is applied. Accordingly, a metallic material (e.g., aluminum and the like) that weighs less than the material of the shaft 110 may be used for the suspension housing.

As the material of the suspension housing 410 partially weighs less than that of the shaft 110, the total weight of the in-wheel motor driving apparatus 1000 may be reduced. The structure where the suspension housing 410 and the shaft 110 are separated is described with reference to FIGS. 7 and 8.

The in-wheel motor driving apparatus 1000 according to an embodiment may further comprise a Hall sensor substrate 300 that is coupled in a replaceable manner through one surface of the circular plate 411.

Figure 3:
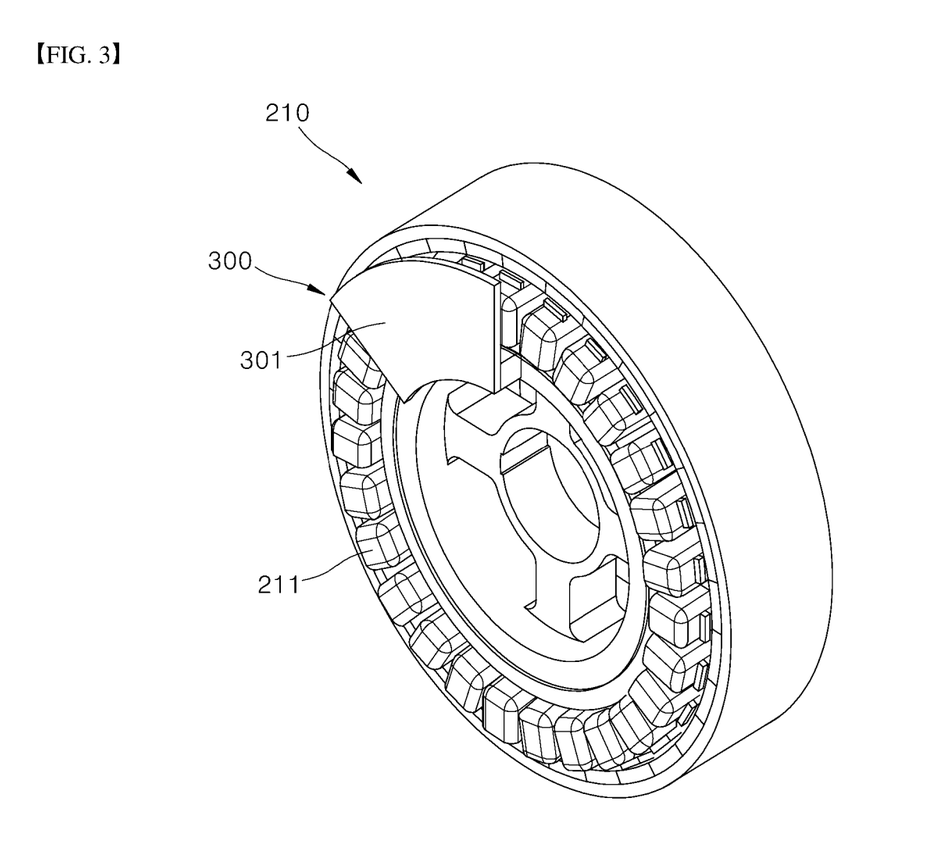
FIG. 3 is a view illustrating a position relationship between a stator of a motor assembly and a Hall sensor substrate that constitute an in-wheel motor driving apparatus according to an embodiment.
Figure 4:
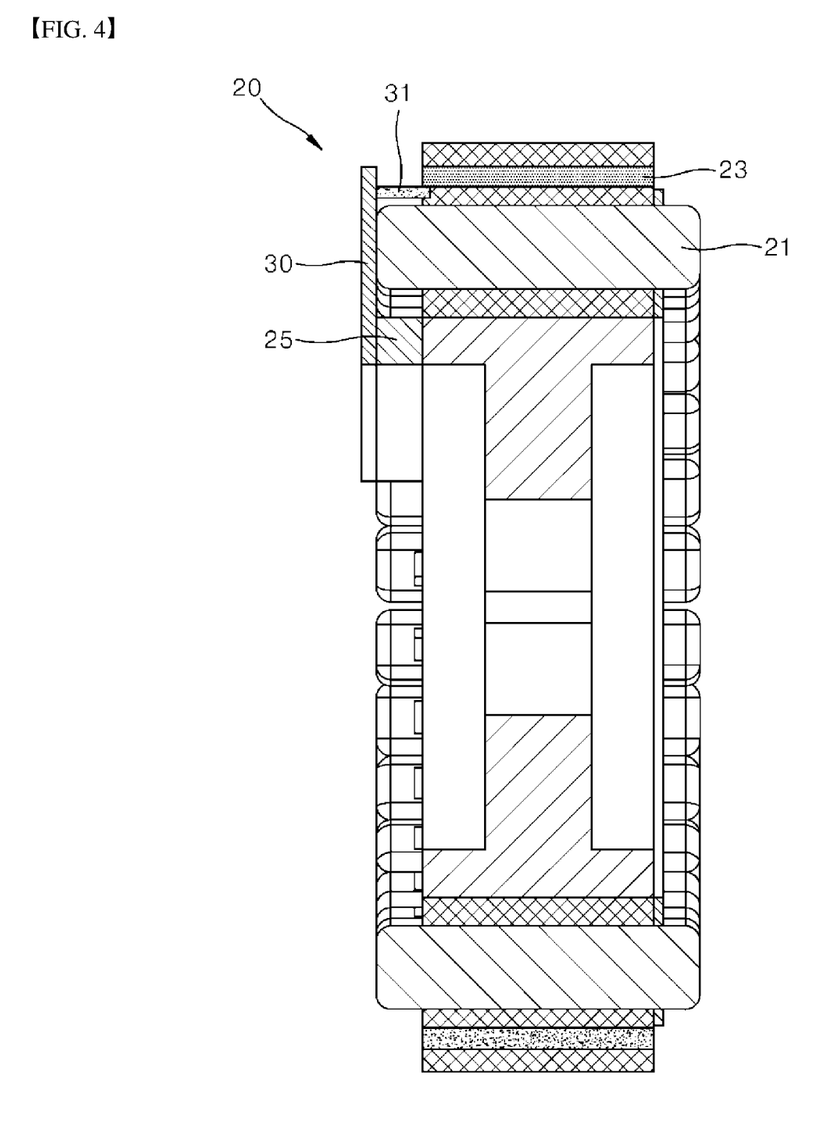
FIG. 4 is a cross-sectional view illustrating a coupling structure of a Hall sensor substrate in an in-wheel motor driving apparatus of the related art.
Figure 5:
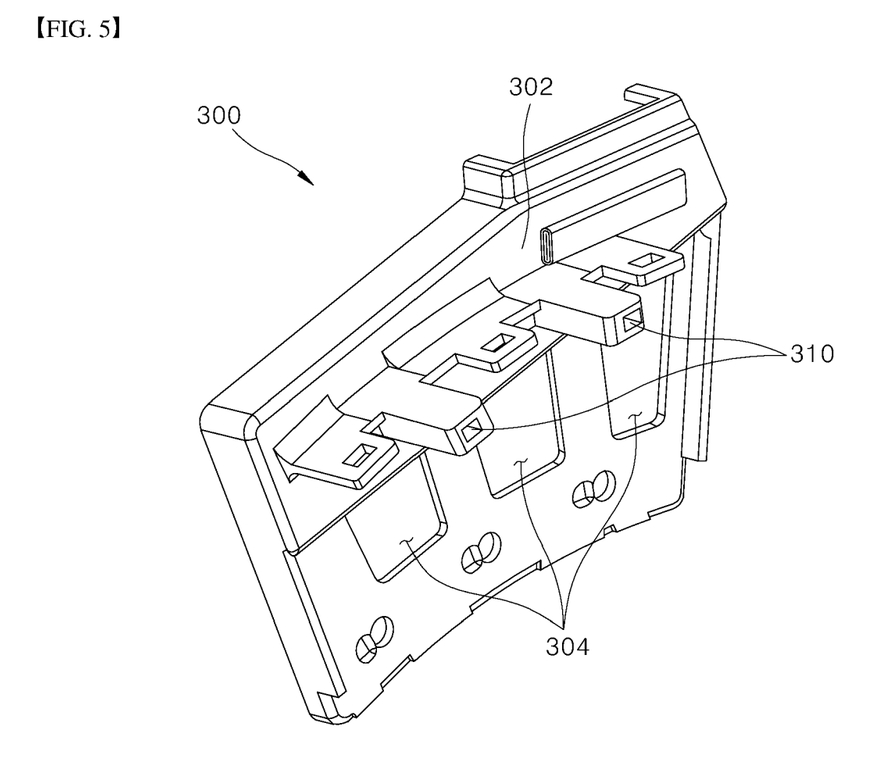
FIG. 5 is a view briefly illustrating a Hall sensor substrate in an in-wheel motor driving apparatus according to an embodiment.

FIG. 3 is a view illustrating a position relationship between a stator of a motor assembly and a Hall sensor substrate that constitute an in-wheel motor driving apparatus according to an embodiment, FIG. 4 is a cross-sectional view illustrating a coupling form of a Hall sensor substrate of the related art, and FIG. 5 is a view briefly illustrating a Hall sensor substrate according to an embodiment.

Referring to FIG. 3, the Hall sensor substrate 300 may be disposed to face one surface of the ring-shaped stator 210 having a plurality of coils 211. The Hall sensor substrate 300 may be provided with one or more Hall sensors (e.g., two Hall sensors and the like) sensing a magnetic force of a magnet in an in-wheel motor.

A Hall senor substrate 30 (see FIG. 4) of the related art has a structure where an additional coupling jig 25 (see FIG. 4) is inserted towards a stator 21 (see FIG. 4) and is attached to one surface of the stator 21 (see FIG. 4). A Hall sensor 31 (see FIG. 4) is directly attached to an outer diameter of the stator 21 (see FIG. 4) and is fixed to the Hall sensor substrate 30 (see FIG. 4) through a soldering process. Accordingly, the Hall sensor 31 (see FIG. 4) of the related art has a high defect rate, and an in-wheel motor 20 has to be disassembled entirely for repairs and maintenance of the Hall sensor substrate 30 (see FIG. 4) as well as the Hall sensor 31 (see FIG. 4) due to a lack of ease in assembly.

The Hall sensor substrate 300 according to an embodiment may have an improved structure that may ensure improved ease in assembly, a reduction in defect rates of the Hall sensor and that may not cause an in-wheel motor to be disassembled entirely for repairs and maintenance.

An entire body of the Hall sensor substrate 300 as illustrated in FIG. 5 may have a PCB molding structure, and preferably, may be provided with a plurality of hole formation portions 304 including holes such that a material is not used partially to make the Hall sensor substrate lightweight. The number, size and shape of the hole formation portions 304 are not limited to those of the illustrated hole formation portions.

An outer surface 301 (see FIG. 3) of the Hall sensor substrate 300 may contact the suspension housing and may be coupled and fixed to the suspension housing, and an inner surface 302 of the Hall sensor substrate 300 may be spaced apart from one surface of the stator 210 (see FIG. 3). The Hall sensor may be provided through a Hall sensor molding portion 310 that is molded at the Hall sensor substrate.

The Hall sensor molding portion 310 may protrude from the inner surface 302 of the Hall sensor substrate 300 towards an outer circumferential surface of the stator 210 (see FIG. 3) to have a predetermined length, and may denote a protrusion integrally formed at the Hall sensor substrate 300. The Hall sensor may be disposed and coupled to an end of the Hall sensor molding portion 310 to accurately sense a magnetic force of a magnet overhang.

Figure 6:
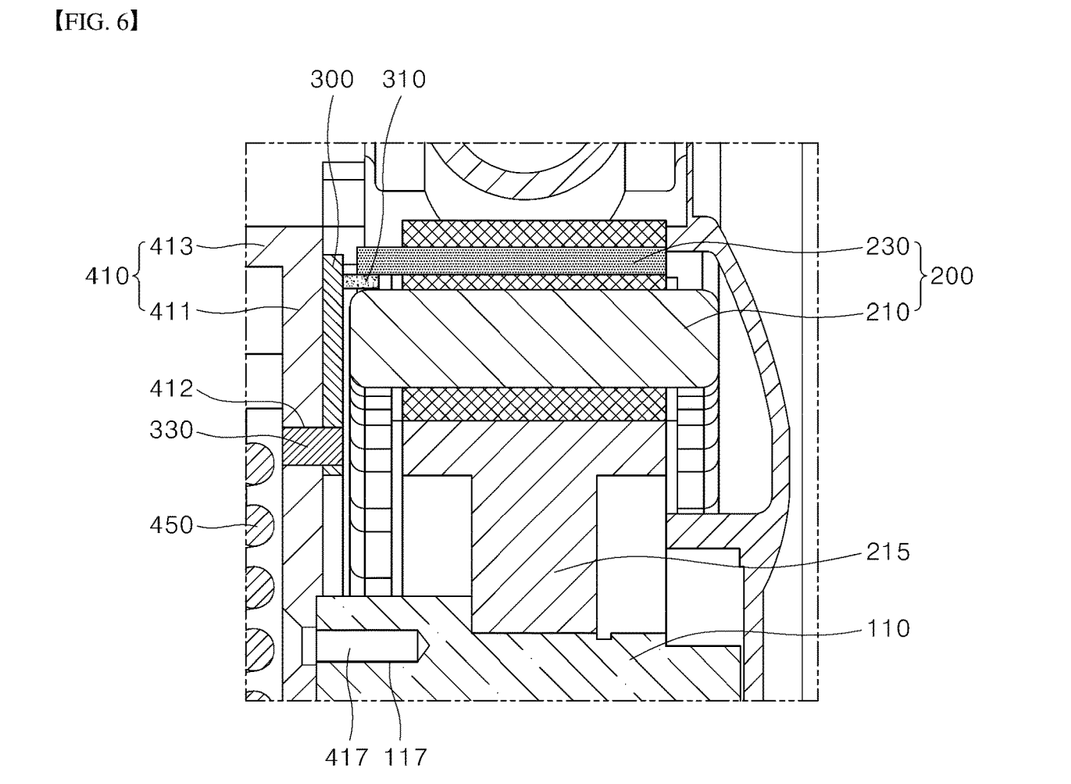
FIG. 6 is an enlarged cross-sectional view illustrating area VI in FIG. 2.

FIG. 6 is an enlarged cross-sectional view illustrating area VI in FIG. 2.

FIG. 6 shows a cross-sectional structure where the Hall sensor substrate 300 is coupled to the circular plate 411 of the suspension housing 410 using a fixation screw 330, and a shape of the Hall sensor molding portion 310 protruding from the inner surface of the Hall sensor substrate 300 towards the outer circumferential surface of the stator 210. The Hall sensor may be coupled to the end of the Hall sensor molding portion 310 molded integrally to the Hall sensor substrate 300.

According to the present disclosure, the Hall sensor substrate 300 may not be directly connected to the stator 210 or the Hall sensor may not be directly attached to the stator 210. The Hall sensor substrate 300 may be screw-coupled to the suspension housing 410 and may be provided with the Hall sensor through the Hall sensor molding portion 310.

Thus, according to the present disclosure, a defect rate of the Hall sensor may be lowered, and the Hall sensor substrate 300 may be easily detached from the suspension housing 410 for repairs and maintenance.

The circular plate 411 may be provided with a screw hole 412 at a position corresponding to a position to which the Hall sensor substrate 300 is coupled. Additionally, the Hall sensor substrate 300 may be mounted onto one surface of the circular plate 411 in a replaceable manner using the fixation screw 330 coupled through the screw hole 412. Further, the shaft 110 may be coupled and fixed to the central portion of the circular plate 411 by a coupling bolt 417.

Figure 7:
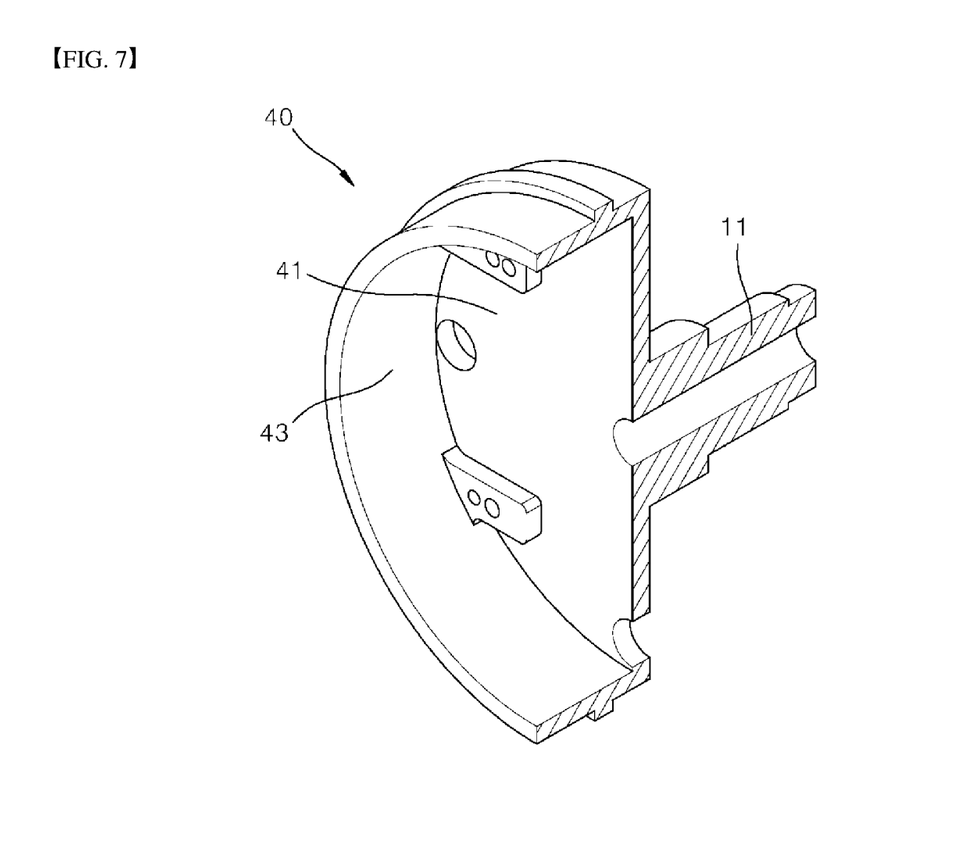
FIG. 7 is a half cross-sectional view illustrating a structure where a suspension housing and a shaft are integrated in an in-wheel motor driving apparatus of the related art.

FIG. 7 is a half cross-sectional view illustrating a structure where a suspension housing and a shaft are integrated in an in-wheel motor driving apparatus of the related art.

As illustrated, the suspension housing 40 of the related art and the shaft 11 of the related art are integrated. In the integrated structure, when the shaft 11 is made of carbon steel for a mechanical structure (e.g., S45C and the like) to ensure rigidity, the suspension housing 40 has to be made of the same material as the shaft, which is not otherwise used for the suspension housing that does not require as much as rigidity as the shaft 11. Thus, the total weight may increase.

Figure 8:
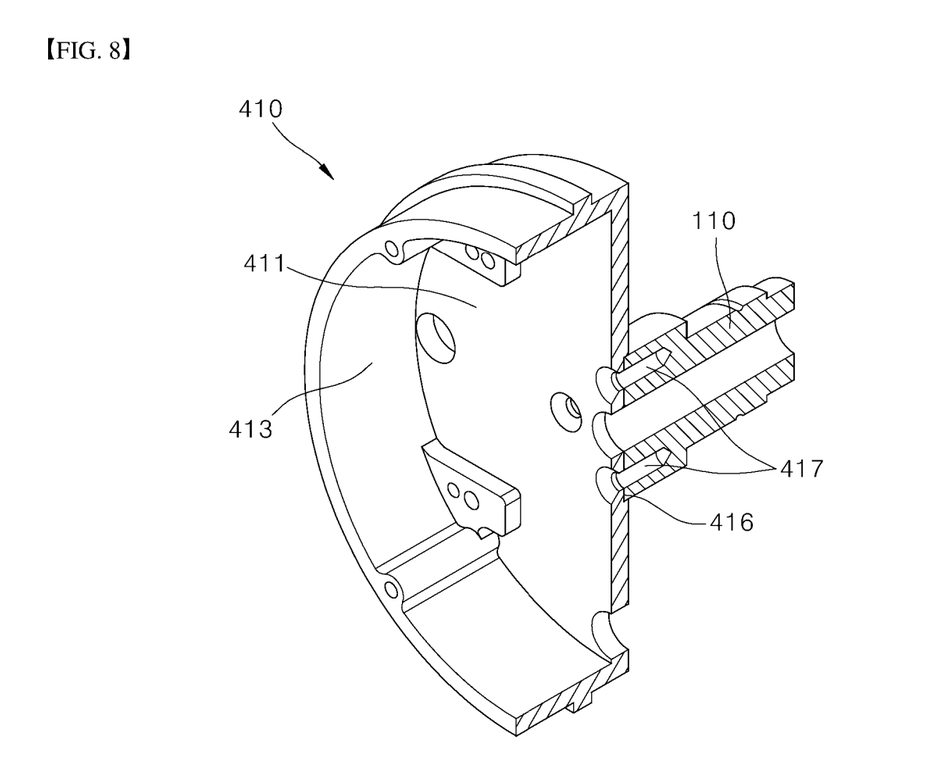
FIG. 8 is a half cross-sectional view illustrating a structure where a suspension housing and a shaft are separated in an in-wheel motor driving apparatus according to an embodiment.

FIG. 8 is a half cross-sectional view illustrating a structure where a suspension housing and a shaft are separated in an in-wheel motor driving apparatus according to an embodiment.

Referring to FIG. 8, the suspension housing 410 and the shaft 110 are separated, and the shaft 110 may be coupled to protrude from the central portion of the circular plate 411 in a direction across one surface of the circular plate.

In this case, the circular plate 411 may be provided with an insertion groove 416 configured to guide a coupling position of the shaft 110 and configured to insert one end (i.e., a portion having an extended diameter) of the shaft 110, at the central portion thereof.

One end of the shaft 110 may be partially inserted through the insertion groove 416, and in the state where one end of the shaft 110 is partially inserted, a plurality of coupling bolts 117 may pass through the circular plate 411 and then may be screw-coupled to one end of the shat 110. The plurality of coupling bolts 117 may comprise two coupling bolts 117 that are disposed to face each other and to have a central angle of 180 degrees.

With the structure where the shaft 110 and the suspension housing 410 are separated from each other, the shaft 110 and the suspension housing 410 may be made of different materials. For example, the shaft 110 may be made of carbon steel for a mechanical structure (e.g., S45C and the like) for ensuring rigidity, and the suspension housing 410 may be made of a metallic material (e.g., aluminum) that weights less than the material of the shaft. Thus, as the material of the suspension housing 410 differs from the material of the shaft 110, the in-wheel motor driving apparatus may become lightweight partially.

The in-wheel motor driving apparatus according to an embodiment may further comprise a rear cover 150 (see FIG. 1) coupled to a side opposite to a side of the motor assembly 200 (see FIG. 1), to which the suspension module 400 (see FIG. 1) is coupled. The rear cover 150 (see FIG. 1) may be coupled to the rim 100 (see FIG. 1), seal the motor assembly 200 (see FIG. 1) and support the shaft 110 (see FIG. 1).

As described above, with the configurations and operations of the present disclosure, an impact from a road surface at the time of driving of a vehicle may be relieved and absorbed. Additionally, with the structure where the suspension housing and the shaft of the in-wheel motor are separated and through the application of different materials appropriate respectively for the suspension housing and the shaft, the total weight of the in-wheel motor may decrease.

Further, the Hall sensor may be readily assembled to the substrate, and may have a low defect rate.

The Hall sensor of the related art is attached to the outer diameter of the stator and soldered to the Hall sensor substrate, resulting in difficulty in assembly and in repairs and maintenance, as the in-wheel motor needs to be dissembled entirely.

Further, the Hall sensor of the related art has a high defect rate. According to the present disclosure, the Hall sensor substrate and the Hall sensor may be molding-connected, and the Hall sensor substrate may be attached to the suspension housing. Accordingly, the in-wheel motor doesn't need to be entirely disassembled when the Hall sensor substrate is replaced, and the Hall sensor may be configured to sense a magnetic force of a magnet overhang, thereby lowering a defect rate of the Hall sensor.

The present disclosure has been described with reference to the embodiments illustrated in the drawings. However, the disclosure is not limited to the embodiments and the drawings set forth herein. Further, various modifications may be made by one having ordinary skill in the art within the scope of the technical spirit of the disclosure. Further, though not explicitly described during description of the embodiments of the disclosure, effects and predictable effects based on the configuration of the disclosure should be included in the scope of the disclosure.

The invention claimed is:

1. An in-wheel motor driving apparatus, comprising:
   a circular rim, an outer wheel of which is surrounded by a tire, which is coupled to the tire, which is provided with a hollow portion therein, through which a shaft passes and to which the shaft is coupled;
   a motor assembly comprising a stator inserted through the hollow portion of the rim, and a rotor disposed to face the stator and to surround the stator and configured to rotate outside the stator;
   a bearing holder coupled to one side of the rim in a ring shape and configured to accommodate a bearing through an inner circumferential surface thereof; and
   a suspension module comprising a suspension housing, an outer circumferential surface of which contacts the bearing, which is inserted into and fixed to the bearing holder and which is separated from the shaft, and a suspension assembly which is coupled into the suspension housing and which is provided with at least one buffer spring,.
   wherein the suspension housing comprises a circular plate inserted into the bearing holder and disposed to face the motor assembly, and
   an outer projection configured to protrude along an edge of the circular plate and disposed to contact the bearing through an outer circumferential surface thereof,
   wherein the suspension assembly is inserted and mounted through a circular groove provided by the circular plate and the outer projection.

2. The driving apparatus of claim 1, wherein the stator is provided with a stator hub connected towards a center in a radial form, therein, and
   the shaft passes through a center of the stator hub and is coupled to the stator hub in a direction across the rim.

3. The driving apparatus of claim 1, wherein the shaft is coupled through a central portion of the circular plate.

4. The driving apparatus of claim 3, wherein the circular plate is provided with an insertion groove configured to guide a coupling position of the shaft and to insert one end of the shaft, at the central portion thereof.

5. The driving apparatus of claim 4, wherein in a state where one end of the shaft is inserted into the insertion groove, a plurality of coupling bolts passes through the circular plate and then is screw-coupled to one end of the shaft.

6. The driving apparatus of claim 1, wherein the suspension housing and the shaft are made of different materials.

7. The driving apparatus of claim 6, wherein the shaft is made of carbon steel for a mechanical structure for ensuring rigidity, and the suspension housing is made of an aluminum-based material that weighs less than the material of the shaft.

8. The driving apparatus of claim 1, wherein the in-wheel driving apparatus further comprises a Hall sensor substrate coupled in a replaceable manner through one surface of the circular plate and provided with at least one Hall sensor molding- fixed to the Hall sensor substrate.

9. The driving apparatus of claim 8, wherein an outer surface of the Hall sensor substrate contacts one surface of the suspension housing and is coupled and fixed to one surface of the suspension housing, and an inner surface of the Hall sensor substrate is spaced apart from the stator.

10. The driving apparatus of claim 9, wherein the at least one Hall sensor is coupled to an end of a Hall sensor molding portion integrally molded with the Hall sensor substrate while protruding from the inner surface of the Hall sensor substrate towards an outer circumferential surface of the stator.

11. The driving apparatus of claim 10, wherein the circular plate comprises a screw hole that is formed at a position corresponding to a position to which the Hall sensor substrate is coupled, and
the Hall sensor substrate is mounted onto one surface of the circular plate using a fixation screw coupled through the screw hole.

12. The driving apparatus of claim 1, wherein a rear cover is coupled to a side opposite to a side of the motor assembly, to which the suspension assembly is coupled, and
the rear cover is coupled to the rim, seals the motor assembly and supports the other end of the shaft.

13. An in-wheel motor driving apparatus, comprising:
a circular rim, an outer wheel of which is surrounded by a tire, which is coupled to the tire, which is provided with a hollow portion therein, through which a shaft passes and to which the shaft is coupled;
a motor assembly comprising a stator inserted through the hollow portion of the rim, and a rotor disposed to face the stator and to surround the stator and configured to rotate outside the stator;
a bearing holder coupled to one side of the rim in a ring shape and configured to accommodate a bearing through an inner circumferential surface thereof; and
a suspension module comprising a suspension housing, an outer circumferential surface of which contacts the bearing, which is inserted into and fixed to the bearing holder and which is separated from the shaft, and a suspension assembly which is coupled into the suspension housing and which is provided with at least one buffer spring,
wherein the suspension housing comprises a circular plate inserted into the bearing holder and disposed to face the motor assembly, and an outer projection configured to protrude along an edge of the circular plate and disposed to contact the bearing through an outer circumferential surface thereof,
wherein the suspension assembly is inserted and mounted through a circular groove provided by the circular plate and the outer projection, and
the in-wheel motor driving apparatus further comprises a Hall sensor substrate coupled to the circular plate in a replaceable manner and provided with at least one Hall sensor.

14. The driving apparatus of claim 13, wherein an outer surface of the Hall sensor substrate contacts one surface of the suspension housing and is coupled to and fixed to one surface of the suspension housing.

15. The driving apparatus of claim 14, wherein an inner surface of the Hall sensor substrate is spaced apart from the stator.

16. The driving apparatus of claim 15, wherein the at least one Hall sensor is coupled to an end of a Hall sensor molding portion integrally molded with the Hall sensor substrate while protruding from the inner surface of the Hall sensor substrate towards an outer circumferential surface of the stator.

17. The driving apparatus of claim 16, wherein the circular plate is provided with a screw hole at a position corresponding to a position to which the Hall sensor substrate is coupled, and the Hall sensor substrate is mounted onto one surface of the circular plate using a fixation screw coupled through the screw hole.

18. The driving apparatus of claim 13, wherein a rear cover is coupled to a side opposite to a side of the motor assembly, to which the suspension assembly is coupled, and
the rear cover is coupled to the rim, seals the motor assembly and supports the other end of the shaft.

\* \* \* \* \*